United States Patent
Lu et al.

(10) Patent No.: US 8,929,166 B2
(45) Date of Patent: Jan. 6, 2015

(54) FAULT MASKING METHOD FOR NON-VOLATILE MEMORIES

(71) Applicant: National Taiwan University of Science and Technology, Taipei (TW)

(72) Inventors: Shyue-Kung Lu, Taipei (TW); Tsu-Lin Li, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 19 days.

(21) Appl. No.: 13/940,353

(22) Filed: Jul. 12, 2013

(65) Prior Publication Data

US 2014/0198592 A1 Jul. 17, 2014

(30) Foreign Application Priority Data

Jan. 16, 2013 (TW) .............................. 102101601 A

(51) Int. Cl.
*G11C 29/18* (2006.01)
*G11C 29/00* (2006.01)

(52) U.S. Cl.
CPC .............. *G11C 29/76* (2013.01); *G11C 29/822* (2013.01)
USPC ........ 365/200; 365/185.09; 365/202; 714/6.1

(58) Field of Classification Search
USPC ......... 365/200, 202, 185.09; 714/3, 6.1, 6.11, 714/6.2
See application file for complete search history.

(56) References Cited

U.S. PATENT DOCUMENTS

| | | | | | |
|---|---|---|---|---|---|
| 4,712,216 | A | * | 12/1987 | Glaise | .......................... 714/6.24 |
| 4,961,193 | A | * | 10/1990 | Debord et al. | ................. 714/753 |
| 5,784,323 | A | * | 7/1998 | Adams et al. | .................. 365/201 |
| 2013/0010550 | A1 | * | 1/2013 | Kim et al. | ................ 365/189.15 |

OTHER PUBLICATIONS

Kuznetsov, Alexander V. et al., "An Error Correcting Scheme for Defective Memory," IEEE Transactions on Information Theory, Nov. 1978, IEEE, vol. IT-24, No. 6.*

* cited by examiner

*Primary Examiner* — Harry W Byrne
*Assistant Examiner* — Lance Reidlinger
(74) *Attorney, Agent, or Firm* — Bacon & Thomas, PLLC

(57) ABSTRACT

A fault masking method is applied to a non-volatile memory array which includes a faulty cell and electrically connected to an address register providing a first address. The faulty cell can only output a fixed value. The content of the first address is not equal to the fixed value. The method includes: providing a complementer electrically connected between the address register and the faulty cell; providing a control word; writing the first address and the control word into the complementer; performing a complement operation on the first address and the control word by the complementer to obtain a second address, and storing the content of the second address into the faulty cell, wherein the content of the second address is equal to the fixed value. The method can reduce or eliminate the usage of redundancy in non-volatile memories, so as to reduce the manufacturing costs and improve the fabrication yield.

6 Claims, 8 Drawing Sheets

FAULT MASKING METHOD FOR NON-VOLATILE MEMORIES

BACKGROUND OF THE INVENTION (1) Field of the Invention

The invention relates to a fault masking method for non-volatile memories, and especially relates to a fault masking method for non-volatile memories using the address scrambling.

(2) Description of the Prior Art

Non-volatile memory is one of the most important kinds of semiconductor memory in the world. It is widely used in the mobile computing products which require high-performance and low-power features. The main characteristic is that the stored data may not disappear after the power is turned off. Therefore, its production value is quite high after integrated with microcontrollers and digital processors. The non-volatile memory includes magneto-resistive random access memory (MRAM), read-only memory (ROM), flash memory, and phase change memory (PCM). Due to the rapid growing of information flows, the data transfer rate also keeps rising significantly. This increases the demands of high-capacity memories. However, during the manufacturing process of non-volatile memories, sophisticated defects will affect the yield of the manufactured products. In order to improve the production yield of memory products and reduce the costs of production, the world-class foundries have developed test and repair solutions, which use the redundant memory to replace faulty memory cells while the memory products fail the test phase.

The conventional memory array with the repair function incorporated usually records the locations of faulty cells during production test and then blows the fuses by the laser-cut equipment. Therefore, an entire memory column (or row) of the redundant memory can be used to replace an entire column (or row) of the main memory which contains faulty bits. FIG. 1A shows an example for the usage of spare columns. During the test phase for a memory array, faulty memory cells usually can be detected. The behaviors of the defects can be categorized into the stuck-at 1 or the stuck-at 0 faults. That is, the read out data is a constant 1 or 0, respectively. If column 1 contains the faulty cell 101, it will be regarded as a faulty column and mapped to the spare column A. We should find a way to record this mapping such that the faulty column will not be used. Due to the re-mapping operation, the processor will not access column 1 but the spare column A instead. The replaced cell 102 is used to replace the faulty cell 101. In addition, the other memory cells of the spare column A should also be used to replace other fault-free cells of column 1.

FIG. 1B is a memory system 200 used to illustrate the operations of the spare columns shown in FIG. 1A. After the test phase, it blows a fuse to indicate the position of the faulty column. Every memory column of the memory array 221 contains a fuse. When the memory system 200 starts operations, it will read out the contents of the fuses 220 and store into the control register 222. The contents of the control register 222 then indicate the locations of faulty columns and the allocated spare columns. When the host sends a memory access instruction, it will compare the accessed address with the stored faulty column addresses stored in the control register 222. If the comparison result indicates that there is a faulty column, it will access from the spare column, rather than attempt to access from the faulty column. Therefore, the control register 222 may provide a spare column address to the address decoder 224, and may not access from the faulty column. Multiple faulty columns can also be repaired by this way. Generally, we can provide a plurality of spare columns 226 to replace multiple faulty columns. Although, the conventional memory with the repair mechanism 200 can significantly improve the yield of the manufacturing process, the hardware overhead of the incorporated spare memory is still relatively high, resulting in a larger volume and the application is limited. Moreover, the replacement mechanism can only achieve a relatively lower yield in the manufacturing process as we consider more sophisticated fault mechanisms.

SUMMARY OF THE INVENTION

Accordingly, one of the purposes of the present invention is to provide a fault masking method for non-volatile memories in order to significantly reduce or even eliminate the requirement of the incorporated redundancy. Therefore, the manufacturing costs can be reduced greatly.

Another object of the present invention is to provide a fault masking method for non-volatile memories, using a dedicated circuit design technique to achieve the effect of fault masking, and improve the process yield of non-volatile memories.

In one aspect, the fault masking method for non-volatile memories is applied to a non-volatile memory array. The non-volatile memory array includes a faulty cell and electrically connected to an address register. The address register provides the first address, wherein the faulty cell only outputs a fixed value and the content of the first address is not equal to the fixed value. The fault masking method for non-volatile memories includes the following steps: providing a complementer which is electrically connected between the address register and the faulty cell; providing a control word and writing the first address and the control word into the complementer; performing a complement operation on the first address and the control word by the complementer to obtain a second address, and storing the second address into the faulty cell, wherein the content of the second address is equal to the fixed value.

In an embodiment, the complementer is an exclusive OR (XOR) logic circuit.

In another embodiment, the fault masking method for non-volatile memories further includes: providing a decoder, electrically connected between the complementer and the non-volatile memory array, so as to decode the second address and access to the faulty cell.

In another embodiment, the fault masking method for non-volatile memories further includes: providing a built-in self-test circuit (BIST), electrically connected to the non-volatile memory array, and the built-in self-test circuit reading the data in the non-volatile memory array.

In another embodiment, the fault masking method for non-volatile memories further includes: providing a multiple-input signature register (MISR), electrically connected to the built-in self-test circuit and the non-volatile memory array, the multiple-input signature register compressing the data in the non-volatile memory array.

In another embodiment, the fault masking method for non-volatile memories further includes: the multiple-input signature register sending the compressed data to the built-in self-test circuit for comparison.

DESCRIPTION OF THE PREFERRED EMBODIMENTS

In the following detailed description of the preferred embodiments, reference is made to the accompanying drawings which forms a part hereof, and in which is shown by way of illustrating specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for the purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1A:
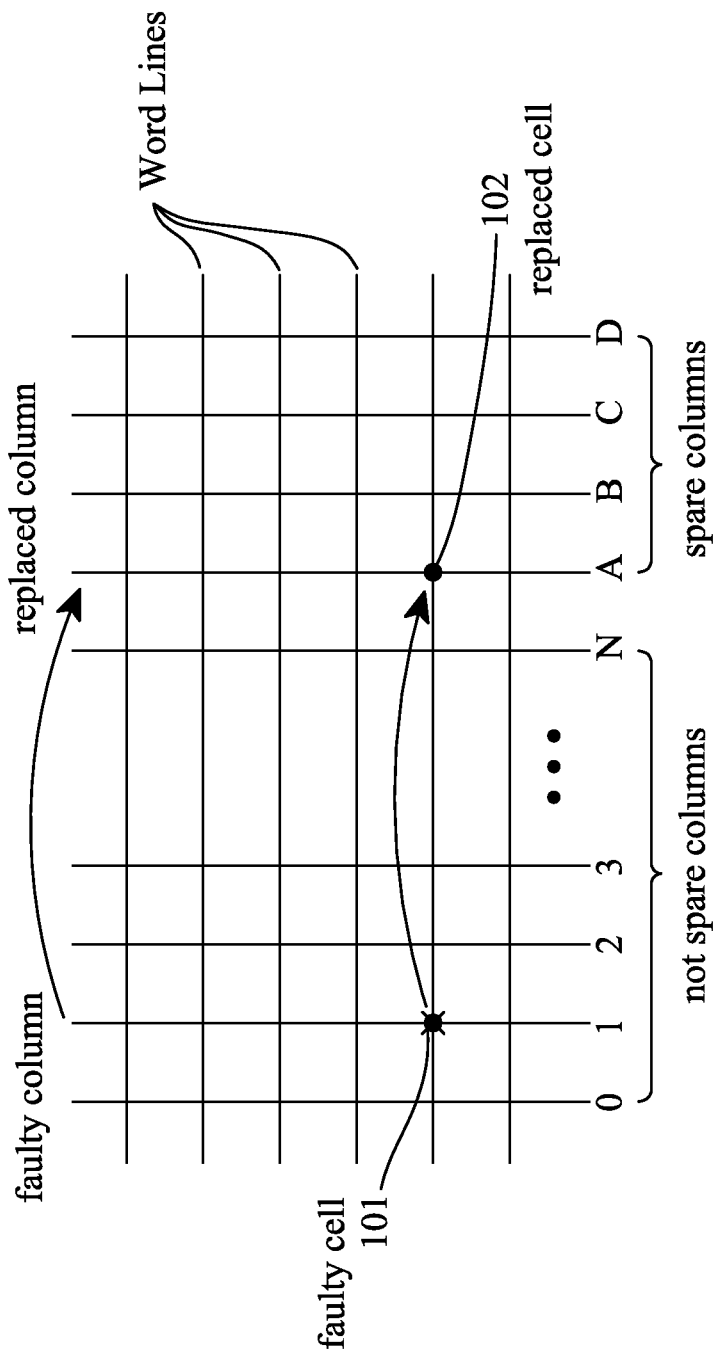
FIG. 1A is an example for the usage of spare columns of the prior art.
Figure 1B:
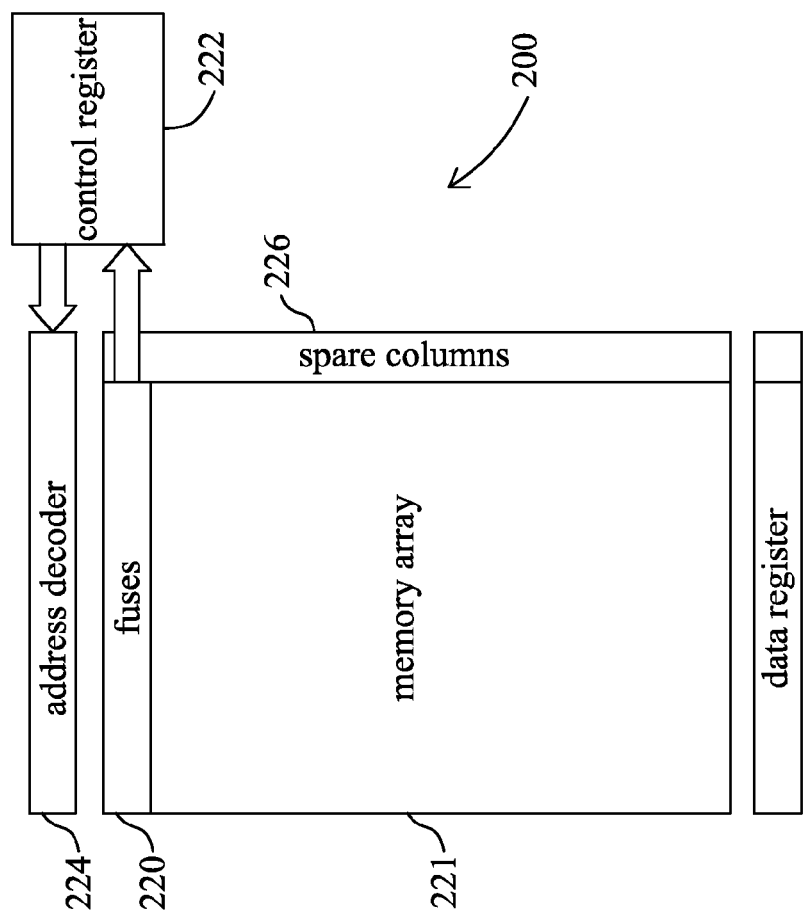
FIG. 1B is a memory system used to illustrate the usage of spare columns shown in FIG. 1A.
Figure 2:
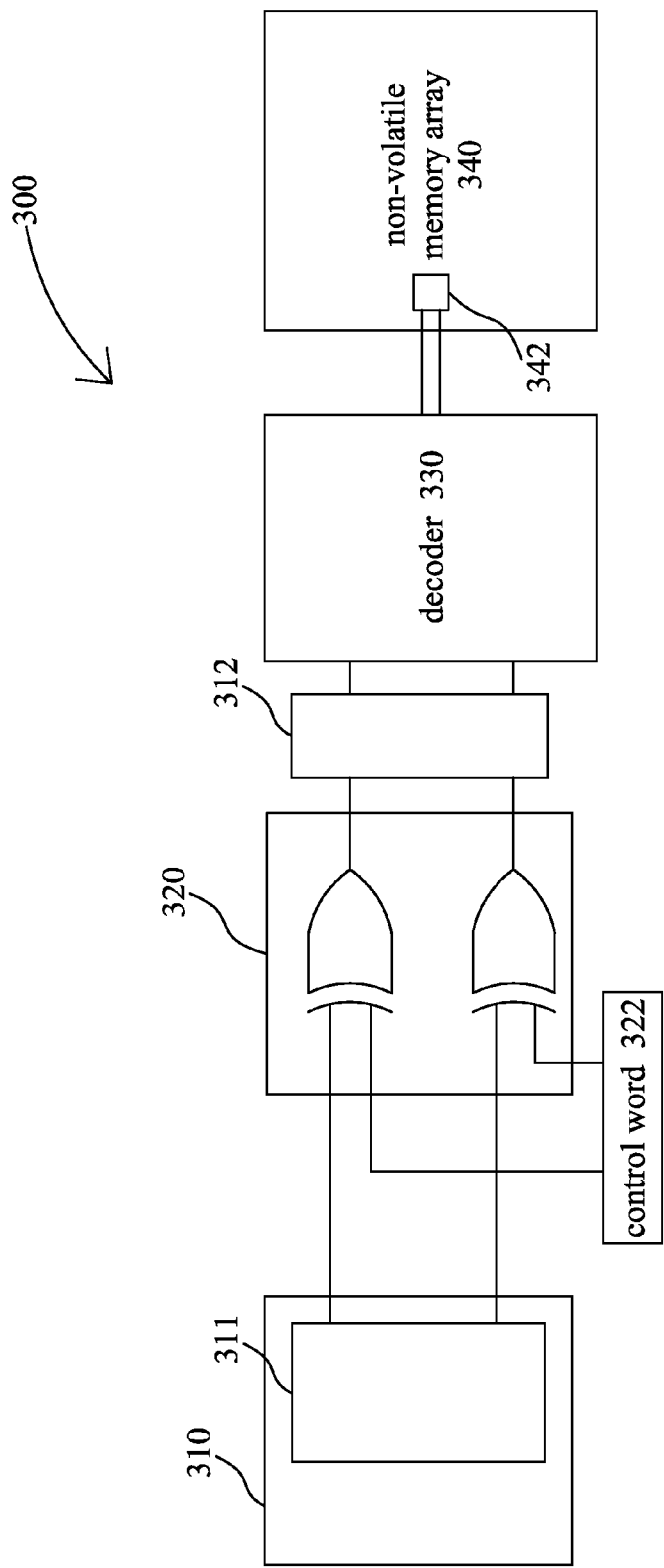
FIGS. 2 and 2A are the non-volatile memory system and the fault masking method for non-volatile memories of the present invention.
Figure 2A:
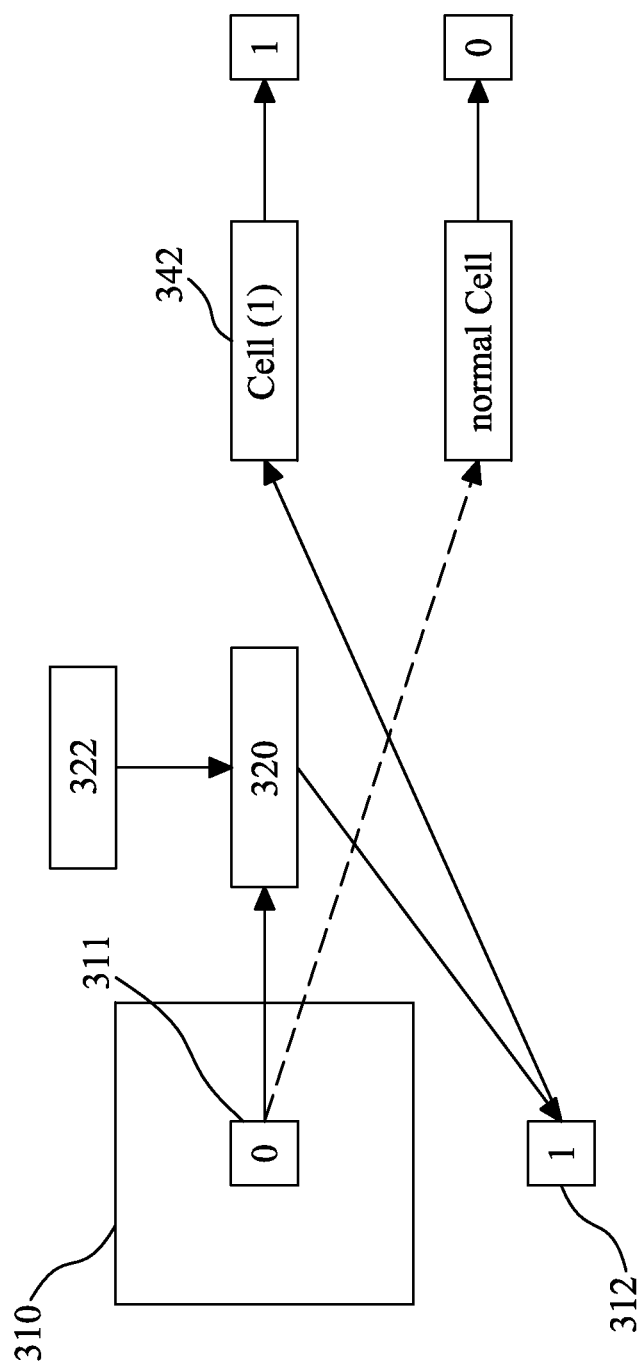

Refer to FIGS. 2 and 2A, it is a non-volatile memory system 300 and the fault masking method for non-volatile memories of the present invention. The non-volatile memory system 300 includes an address register 310, a non-volatile memory array 340 and a complementer 320. The address register 310 is electrically connected to the non-volatile memory array 340, and is used to store the first address 311. The non-volatile memory array 340 includes a faulty cell 342, and the complementer 320 is electrically connected between the faulty cell 342 and the address register 310. The faulty cell 342 can only output a fixed value, and the content of the first address 311 is not equal to the fixed value. The emphasis in FIGS. 2 and 2A is that the first address 311 and the control word 322 perform the complement operation to obtain a new second address 312, the content in the address refers to the data to be written in the address. The cell (1) refers to the faulty cell 342, regardless the input data is "1" or "0", the cell (1) can only output data "1". The complementer 320 generates a second address 312 according to the first address 311 and a control word 322, and makes the data "1" of the second address 312 written into the faulty cell (1). Note that the method does not need any operation for the data stored in the first address 311.

Figure 3:
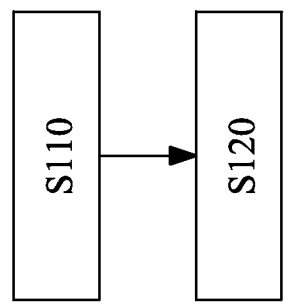
FIG. 3 is one embodiment of the fault masking method for non-volatile memories of the present invention.

Refer to FIG. 3, it is the fault masking method for non-volatile memories of the present invention, the fault masking method for non-volatile memories is applied to the non-volatile memory system 300. Please also refer to FIG. 2 and FIG. 3, the fault masking method for non-volatile memories of the present invention includes the following steps:

Step S110: Providing a control word 322 and writing the first address 311 and the control word 322 into the complementer 320.

Step S120: The complementer 320 makes the first address 311 and the control word 322 perform a complement operation to obtain a second address 312, and stores the content of the second address 312 into the faulty cell 342, note that content of the second address 312 is equal to the fixed value.

The first address 311 and the second address 312 are logical addresses, respectively including one bit or one byte of data. The content in the first address 311 may be 0, and the content in the second address 312 may be 1. The faulty cell 342 is a physical address, the physical address is also a storage space which can be used to store a bit or a byte of data, and the failure mode of the faulty cell 342 is that regardless the input content in the address is 0 or 1, the faulty cell 342 can only output a fixed value, for example, only output 1, also known as stuck-at-1. Therefore, in the absence of the mechanism of the present invention, there may occur the circumstance that the first address 311 (the content is 0) storing in the faulty cell 342 (the fixed value is 1), then it may be such the input data is 0, but the output data is 1 so as to cause failure. However, in the operating mechanism of the present invention, before the first address 311 (for example, 0) is stored in the faulty cell 342 (for example, 1), the complementer 320 uses the control word 322 (for example, 1) and the first address 311 to perform a complement operation, thereby to obtain a second address 312, wherein the bit numbers are the same in the control word 322 and the addresses. For example, the first address has two bits and there are two control words in the present embodiment.

In an embodiment, the complementer 320 may be an exclusive OR (XOR) logic circuit, the truth table for the exclusive OR logic circuit can refer to Table 1. The first address 311 (for example, 0) and the control word 322 (for example, 1) pass through the exclusive OR (XOR) logic circuit together, and generate a second address 312. The exclusive OR logic circuit makes the first address (for example, 0) and the control word (for example, 1) performing a complement operation, so that the content of the first address (for example, 0) may not be stored in the faulty cell 342 (for example 1), but stored into another faulty cell which has a fixed value 0 or is a normal cell. Beside, the exclusive OR logic circuit makes the second address (for example, 1) stored in the faulty cell 342 (for example, 1).

TABLE 1

| the first address 311 | the control word 322 | the second address 312 |
|---|---|---|
| 0 | 0 | 0 |
| 0 | 1 | 1 |
| 1 | 0 | 1 |
| 1 | 1 | 0 |

Figure 4:
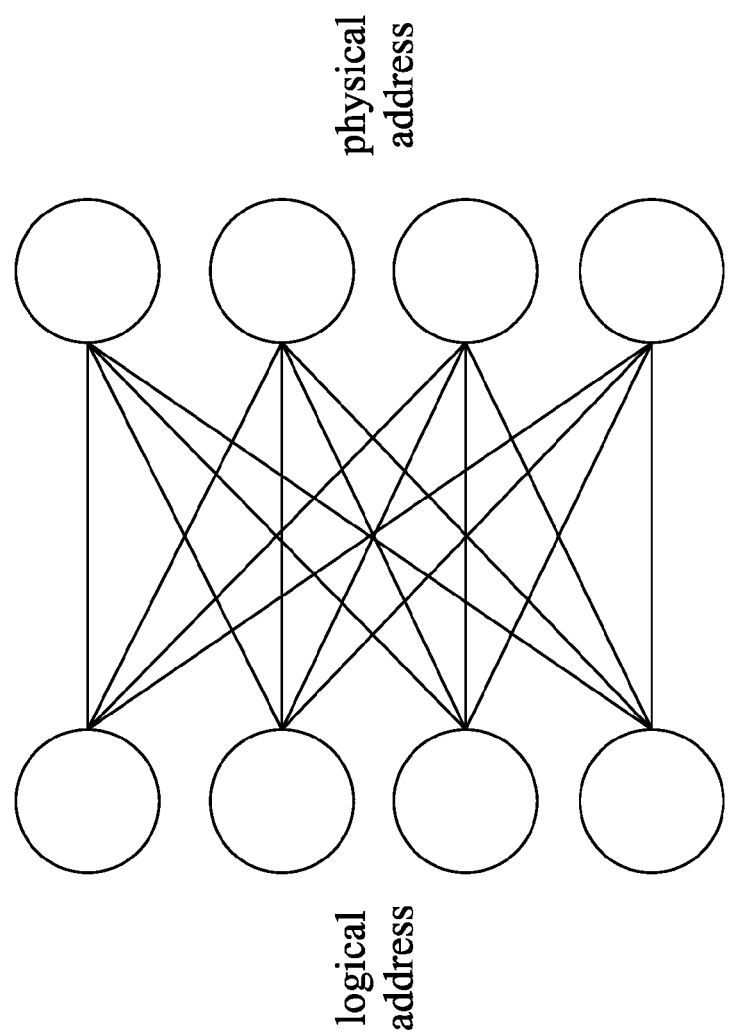
FIG. 4 is one embodiment of the address scrambling method.

The fault masking method for non-volatile memories of the present invention also provides a decoder 330, it is electrically connected between the complementer 320 and the non-volatile memory array 340, in order to decode the second address 312 and access to the faulty cell 342. The fault masking method for non-volatile memories of the present invention amends the traditional one-to-one mapping between the logical address and the physical address. Therefore, we refer the fault masking method for non-volatile memories to the address scrambling method. Refer to FIG. 4, it shows the address scrambling method. There are sixteen address scrambling types for four logical addresses and four physical addresses. That is to say, if there are N address bits, it has $2^N$ kinds of pairing. By the address scrambling method, the logical address in which the content is 0 could be stored in the physical address in which the fixed value is 0. Similarly, the logical address in which the content is 1 could be stored in the physical address in which the fixed value is 1. Therefore, the fault effect is masked and may not be activated.

Figure 5:
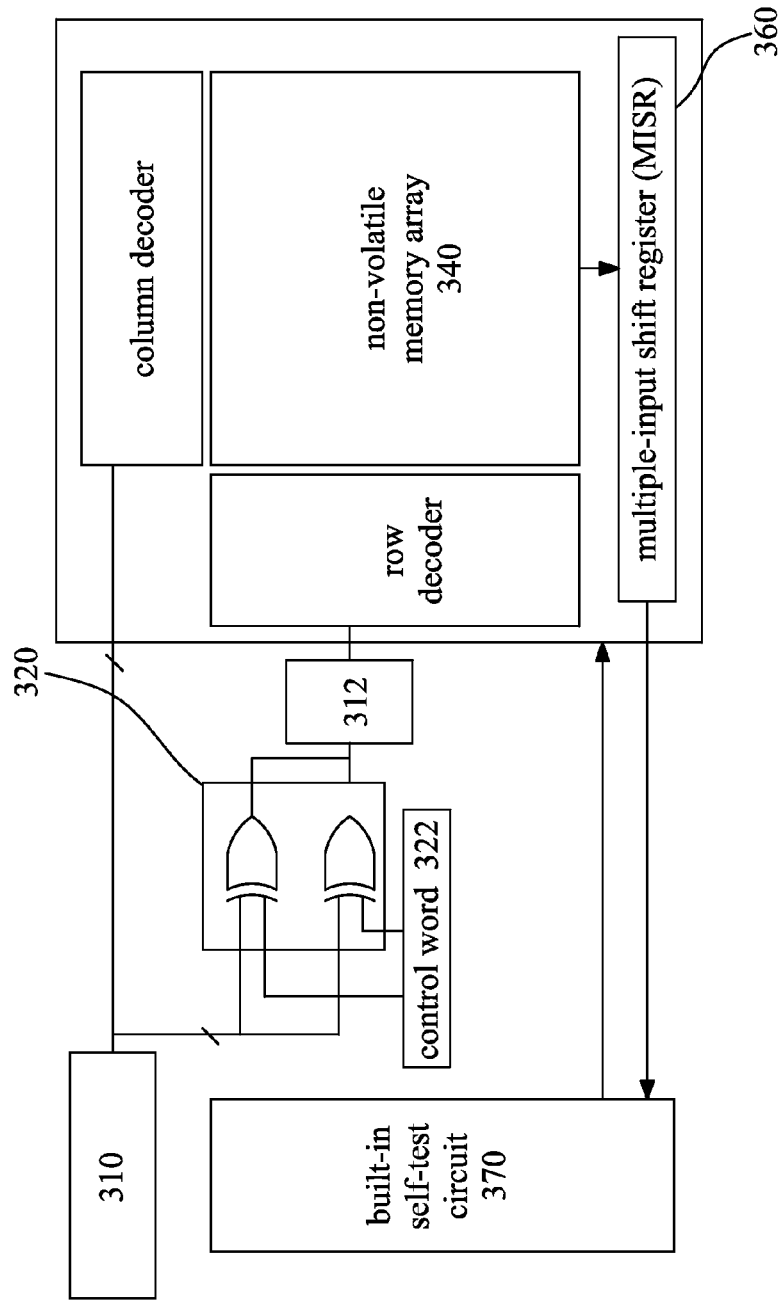
FIG. 5 and FIG. 6 show the fault masking method for non-volatile memories of the present invention integrated with the built-in self-test circuit.
Figure 6:
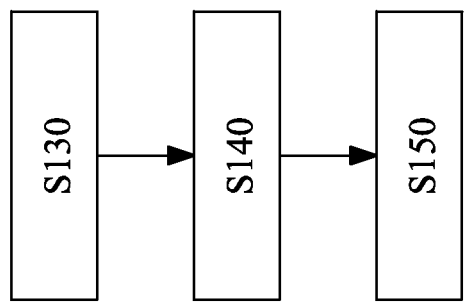

FIG. 5 and FIG. 6 show that the fault masking method for non-volatile memories of the present invention can be easily integrated with the popularly used built-in self-test (BIST) circuit. The integration method can refer to the following steps:

Step S130: Providing a built-in self-test circuit (BIST) 370 electrically connected to the non-volatile memory array 340. The built-in self-test circuit 370 reads the data in the non-volatile memory array 340.

Step S140: Providing a multiple-input signature register (MISR) 360 electrically connected to the built-in self-test circuit 370. The multiple-input signature register 360 compresses the data in the non-volatile memory array 340.

Step S150: The multiple-input signature register 360 sends the compressed data to the built-in self-test circuit 370 for comparison.

The memory fault masking method for non-volatile memories could be applied to the columns and rows of the non-volatile memory. By using the fault masking method, we can greatly reduce or even eliminate the usage of redundancy and the fault masking effect can be achieved. Therefore, it can reduce the costs of the manufacturing of non-volatile memories. Moreover, the fabrication yield can also be improved significantly for non-volatile memories.

The foregoing description of the preferred embodiment of the invention has been presented for the purposes of illustration and description. It is not intended to be exhaustive or to limit the invention to the precise form or to exemplify the embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suitable to the particular use or implementation contemplated. It is intended that the scope of the invention is defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fault masking method for non-volatile memories, applied to a non-volatile memory array, the non-volatile memory array comprising a faulty cell and electrically connected to an address register, the address register providing a first address, wherein the faulty cell outputs a fixed value and the content of the first address is not equal to the fixed value, the fault masking method for non-volatile memories comprising:

providing a complementer electrically connected between the address register and the faulty cell;

providing a control word, and writing the first address and the control word into the complementer; and performing a complement operation on the first address and the control word by the complementer to obtain a second address, and storing the second address into the faulty cell, wherein content of the second address is equal to the fixed value.

2. The fault masking method for non-volatile memories of claim 1, wherein the step of providing a complementer is providing an exclusive OR logic circuit.

3. The fault masking method for non-volatile memories of claim 2, further comprising:

providing a decoder electrically connected between the complementer and the non-volatile memory array, so as to decode the second address; and the decoder inputting the content of the decoded second address into the faulty cell.

4. The fault masking method for non-volatile memories of claim 3, further comprising:

providing a built-in self-test circuit electrically connected to the non-volatile memory array; and the built-in self-test circuit reading the data in the non-volatile memory array.

5. The fault masking method for non-volatile memories of claim 4, further comprising:

providing a multiple-input signature register electrically connected to the built-in self-test circuit and the non-volatile memory array, the multiple-input signature register compressing the data in the non-volatile memory array.

6. The fault masking method for non-volatile memories of claim 5, further comprising:

the multiple-input signature register sending the compressed data to the built-in self-test circuit for comparison.

\* \* \* \* \*